United States Patent
Chen

(10) Patent No.: US 6,891,244 B2
(45) Date of Patent: May 10, 2005

(54) PLUG STRUCTURE HAVING LOW CONTACT RESISTANCE AND METHOD OF MANUFACTURING

(75) Inventor: Neng-Kuo Chen, Hsinchu (TW)

(73) Assignee: Winbond Electronics Corporation (TW)

( * ) Notice: Subject to any disclaimer, the term of this patent is extended or adjusted under 35 U.S.C. 154(b) by 26 days.

(21) Appl. No.: 10/294,723

(22) Filed: Nov. 15, 2002

(65) Prior Publication Data

US 2004/0018718 A1 Jan. 29, 2004

(30) Foreign Application Priority Data

Jul. 12, 2002 (TW) .................................... 91115617 A

(51) Int. Cl.[7] ........................ H01L 31/07; H01L 31/108
(52) U.S. Cl. ...................... 257/486; 257/616; 257/751; 257/763; 438/653; 438/656; 438/672; 438/685
(58) Field of Search ................................ 438/653, 656, 438/672, 685; 257/485–486, 616, 751, 763

(56) References Cited

U.S. PATENT DOCUMENTS 5,700,717 A * 12/1997 Nowak et al. ............... 438/629
5,817,572 A * 10/1998 Chiang et al. ............... 438/624

FOREIGN PATENT DOCUMENTS

JP 04-196420 * 7/1992 ........... H01L/21/28

* cited by examiner

Primary Examiner—Hsien Ming Lee
(74) Attorney, Agent, or Firm—Dickinson Wright PLLC

(57) ABSTRACT

A manufacturing method of a plug structure having low contact resistance includes the following steps. First, a silicon substrate and a BPSG layer covering thereon are provided. The silicon substrate has a dopant area. Next, the BPSG layer is etched to form a contact window to be contiguous with the dopant area. If the dopant area is doped with boron, a silicon-germanium layer is formed upon the dopant area as a barrier layer. Then, a barrier layer is formed next to the contact window, and a metal plug surrounded by the barrier layer is formed. After conductive interconnecting lines are formed upon the BPSG layer, a rapid thermal annealing is adopted to reactivate the dopant area. In the case that the boron is doped in the dopant area, the silicon-germanium layer keeps the boron from migrating to the barrier layer to lower the contact resistance of the plug structure.

14 Claims, 6 Drawing Sheets

PLUG STRUCTURE HAVING LOW CONTACT RESISTANCE AND METHOD OF MANUFACTURING

BACKGROUND OF THE INVENTION

1. Field of Invention

The present invention relates to a method of manufacturing a plug structure, and more particularly, the present invention relates to a method of manufacturing a plug structure having low contact resistance.

2. Description of Related Art

One main reason for progress in electronic technology nowadays is the realization of different kinds of electronic devices such as transistors, capacitors and resistors in an integrated circuit with high density by means of semiconductor technology.

In a semiconductor apparatus, these different kinds of electronic devices are connected to each other through conductive interconnecting lines. Each area of the electronic devices such as source and drain of the transistor depends on a vertical conductive line called a plug connecting the conductive interconnecting lines.

A conventional plug structure is illustrated in FIG. 1. There is a dopant area 102 in a substrate 101. The dopant area 102 is, for example, a source or drain of the transistor. There is a BPSG layer 103 on the silicon substrate 101 to form a dielectric layer. A conductive interconnecting line 106 is on the BPSG layer 106. In order to transmit signals from the dopant area 102 to the conductive interconnecting lines 106, a vertical conductor is needed, e.g., a metal plug 105. However, the adhesion strength for the metal plug 105 to the silicon substrate 101 and the BPSG layer 103 is not enough, and thus a barrier layer 104 is positioned between the substrate 101, the BPSG layer 103 and the plug 105. The barrier layer 104 is, for example, a thin film composed of a Ti layer 1041, a TIN layer 1042 and a Ti layer 1043.

As the linewidth narrows in the semiconductor process, the method of reducing the contact-resistance of conductive lines becomes increasingly important. This is particularly true around the peripheral area of the semiconductor, where vertical height of the plug is higher than other places and the problem of the contact-resistance becomes more serious. This is because the semiconductor process is composed of a sequence of complex procedures and the later procedures usually affect the structure formed in the former. For example, the process of forming the conductive interconnecting lines may subject the semiconductor to a high temperature for a long time and lead to inactivation of the dopant area and consequently raise contact-resistance.

SUMMARY OF THE INVENTION

In accordance with the foregoing description, the resistance problem of the plug that occurs within the circuit of the peripheral area in a semiconductor is more serious than that in other places. Hence, it is therefore an objective of the present invention to provide a plug structure having low contact resistance and a manufacturing method thereof. The elimination of the contact resistance from the plug will bring an essential contribution to the entire design of the semiconductor.

As embodied and broadly described herein, the invention provides a substrate whereon are formed a first dopant area and a dielectric layer. Next, the dielectric layer is etched to define a contact window with the substrate. In the embodiment, a partial boundary of the contact window is adjacent to the first dopant area. Next, a second dopant area is formed on the substrate through the partial boundary of the contact window mentioned above. The second dopant area is overlaid with the first dopant area.

Next, a barrier layer is formed. One side of the barrier layer is adjacent to the contact window and the other side is defined as a plug window with a metal plug formed therein. Then, a conductive interconnecting line is formed on the dielectric layer. After that, a rapid thermal annealing is performed.

According to a preferred embodiment of the present invention, after a conductive interconnection is formed, a rapid thermal annealing process is performed to reactivate the dopant area, thereby lowering the contact resistance of the plug.

A preferred embodiment of the present invention further comprises a barrier layer. The barrier layer is positioned between the first dopant area, the second dopant area and the barrier layer such that the temperature within the semiconductor process does not affect the dopant in the first dopant area and the second dopant area or cause the dopant to migrate to the barrier layer by thermal diffusion to lower the contact resistance of the plug.

BRIEF DESCRIPTION OF THE DRAWINGS

The invention can be more fully understood by reading the following detailed description of the preferred embodiment, with reference made to the accompanying drawings, wherein.

DESCRIPTION OF THE PREFERRED EMBODIMENTS

The present invention discloses a plug structure having low contact resistance and a manufacturing method thereof. In order to illustrate the embodiment of the present invention, reference is made to FIGS. 2A to 2E and FIG. 3. FIGS. 2A to 2E are views of different steps for manufacturing a plug structure having low contact resistance and FIG. 3 is a flow chart of the manufacturing method for the present invention.

Figure 1:
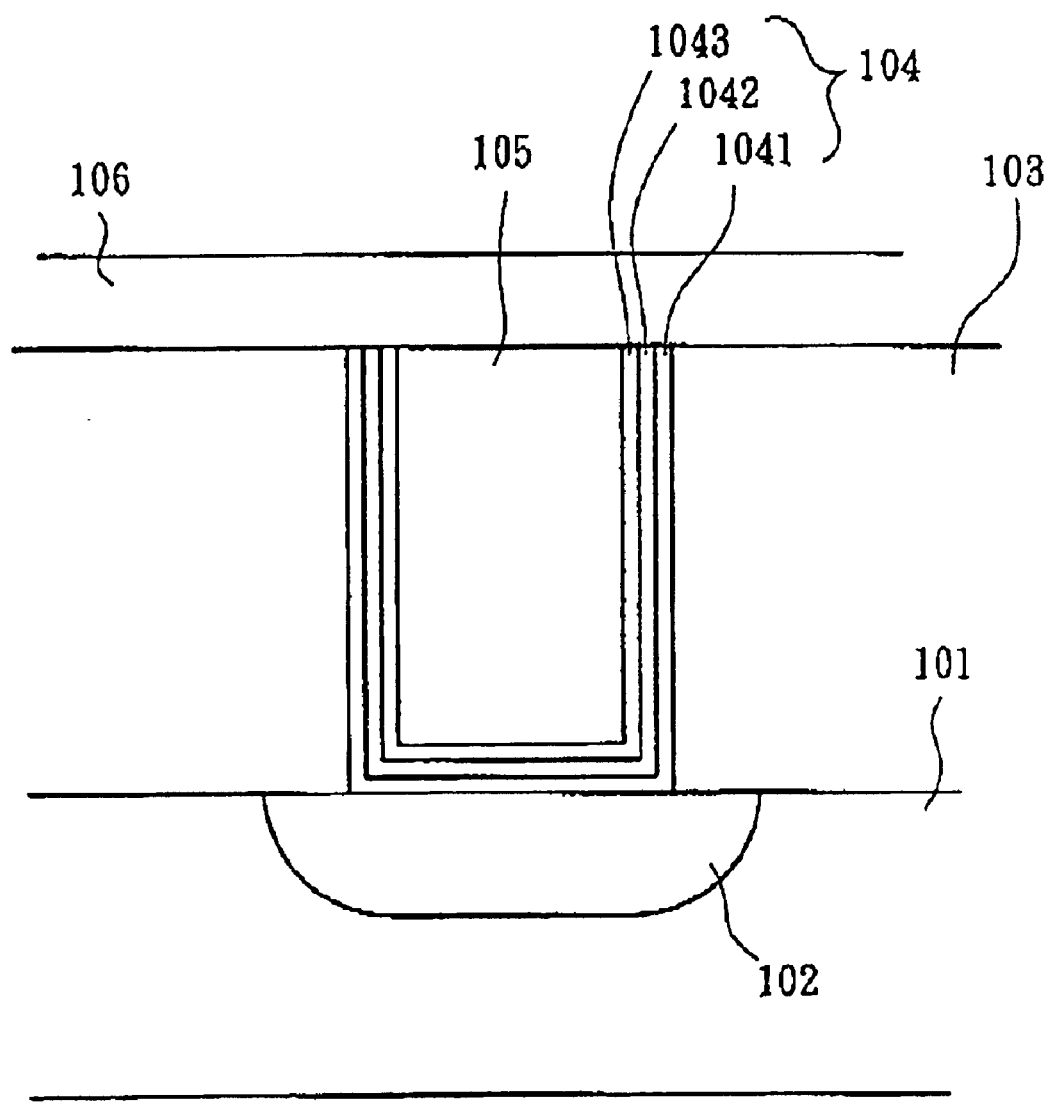
FIG. 1 is a plug structure of the prior art.
Figure 2A:
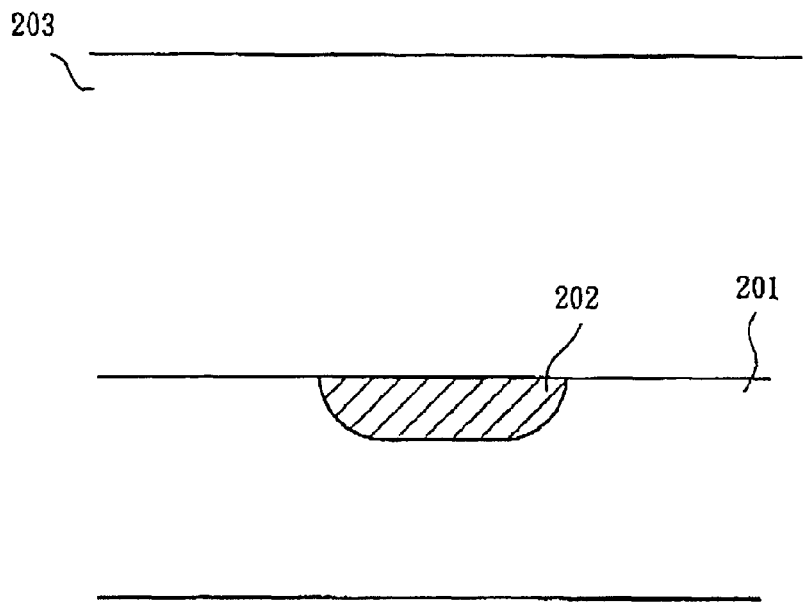
FIG. 2A depicts the first step of the embodiment of the present invention.
Figure 3:
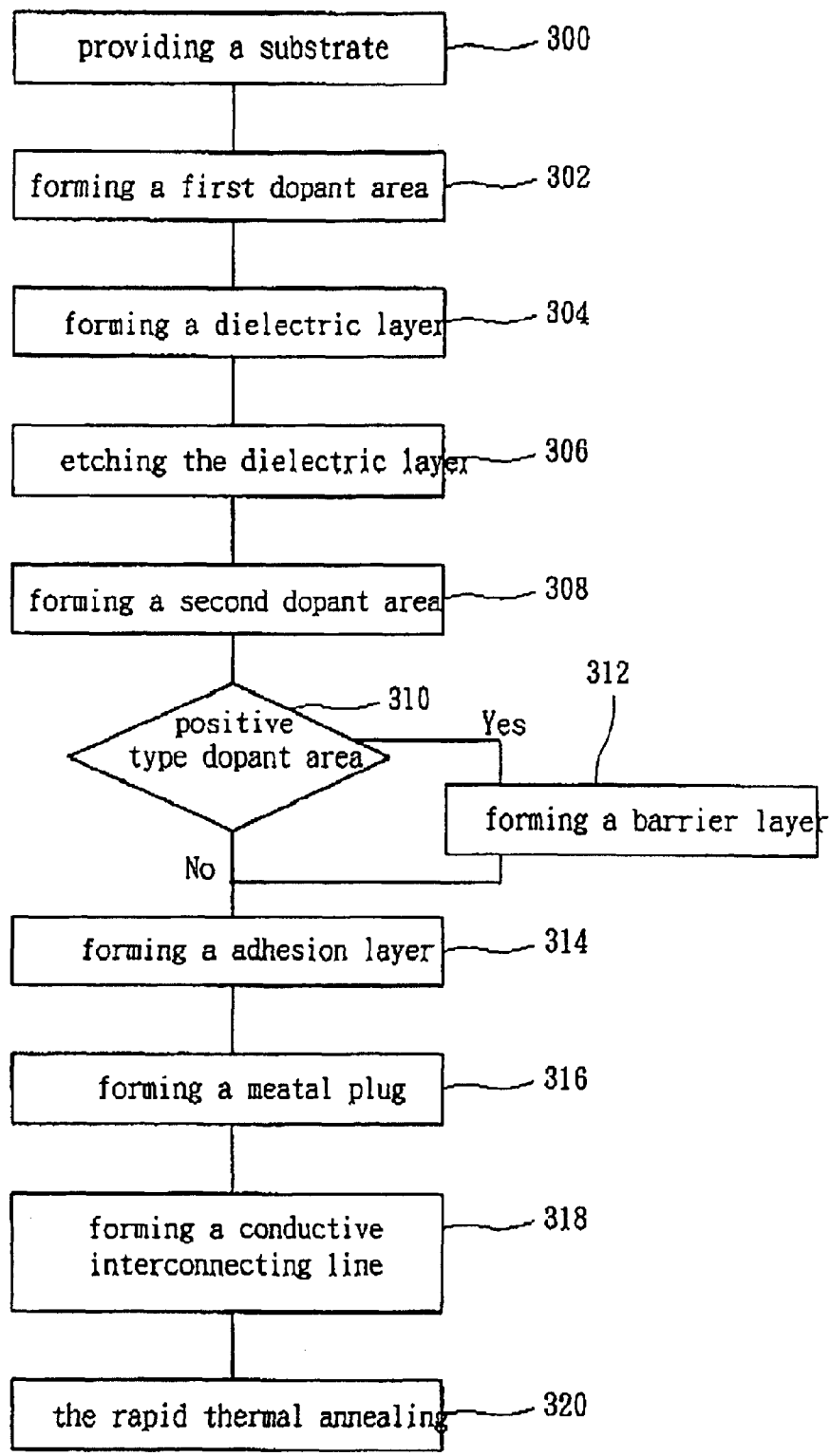
FIG. 3 depicts the flow chart of manufacturing the embodiment of the present invention.

First, reference is made to FIG. 3 and FIG. 2A. In sequence, a substrate 201 (step 300) is provided, a first dopant area 202 is formed (step 302) and a dielectric layer 203 (step 304) where one embodiment of the substrate 201 includes semiconductor such as Si, GaAs or the like and one embodiment of the first dopant area 202 includes a negative-type dopant area and a positive-type dopant area. One embodiment of the negative-type dopant area includes doping with a dopant such as P, As or the like which can provide the electrons and one embodiment of the positive-type dopant area includes doping an acceptor such as B which can provide the holes. One embodiment of the dielectric layer 203 includes an insulator such as BPSG.

Figure 2B:
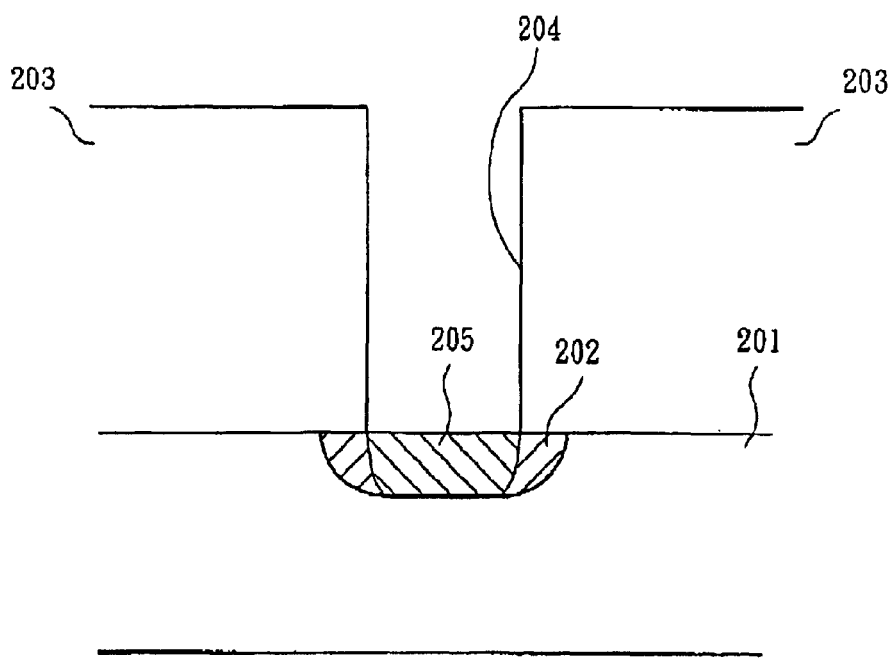
FIG. 2B depicts the second step of the embodiment of the present invention.

Next, reference is made to FIG. 3 and FIG. 2B. The dielectric layer 203 (step 306) is etched to define a contact window 204 with the substrate 201. The partial boundary of the contact window 204 is adjacent to the first dopant area 202. Then, a second dopant area 205 (step 308) is formed through the partial boundary of the contact window 204. The second dopant area 205 is partially overlaid with the first dopant area 202. The method of one embodiment which is used for etching the dielectric layer 203 includes reactive ion etching. One embodiment of the second dopant area 205 is doped with the same dopant as the first dopant area 202 but in a higher concentration. One embodiment of the contact window 204 is positioned on the peripheral area of a semiconductor apparatus. Because a deeper plug has been formed in the peripheral area, the characteristics thereof differ from those of other areas. Hence, to improve the electric conductivity, a higher concentration of dopant is doped in the original first dopant area 202.

Figure 2C:
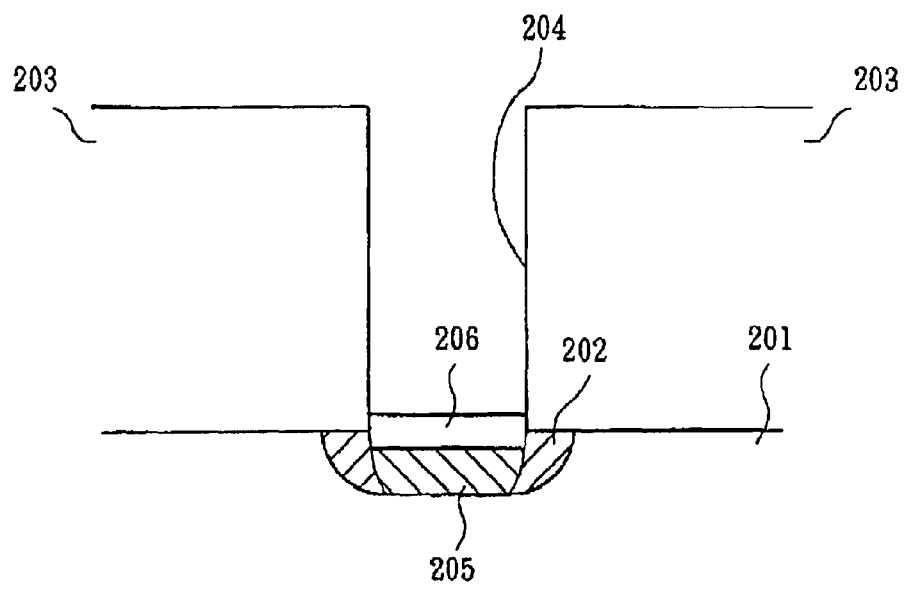
FIG. 2C is depicts the third step of the embodiment of the present invention.

Next, reference is made to FIG. 3 and FIG. 2C. If the first dopant area 202 and the second dopant area 205 include a positive-type dopant area (step 310), a barrier layer 206 is formed on the second dopant area 205 (step 312). Conversely, if the first dopant area 202 and the second dopant area 205 include a negative-type dopant area, a barrier layer 206 need not be formed. Forming the barrier layer 206 in one embodiment includes using Physical Vapor Deposition (PVD) or the Chemical Vapor Deposition (CVD). Forming the barrier layer 206 in another embodiment includes using an ion implantation to drive in the ionic form of the barrier element to the substrate 201. The embodiment of the barrier layer 206 is a thin film comprising Ge, Mo and Ta. The barrier layer 206 serves to prevent the dopant of the positive-type dopant area (the first dopant area 202 and the second dopant area 205) from migrating to the barrier layer 207 by thermal diffusion and there reacting with the barrier layer 207, thus lowering the contact resistance of the plug.

Figure 2D:
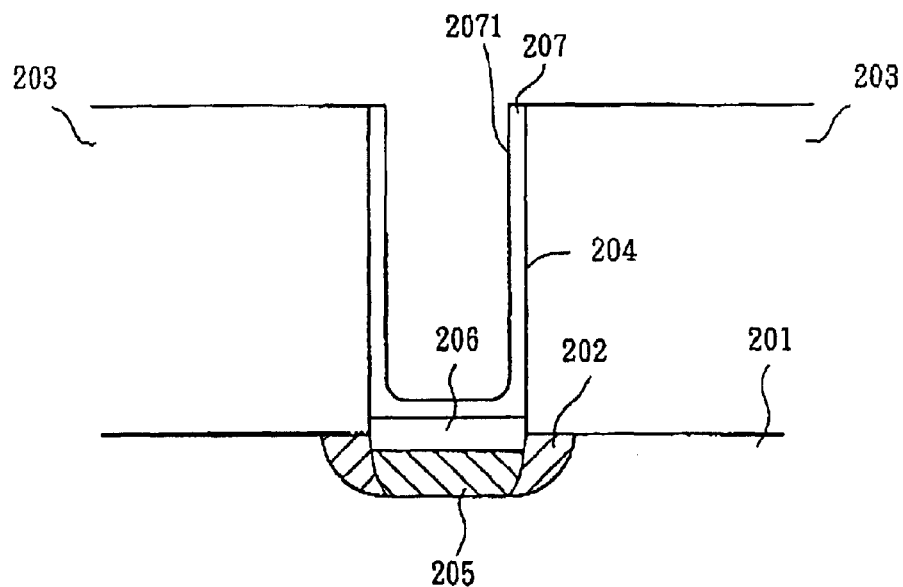
FIG. 2D depicts the fourth step of the embodiment of the present invention.

Next, reference is made to FIG. 3 and FIG. 2D. A barrier layer 207 is formed (step 314). One side of the barrier layer 207 is adjacent to the contact window 204 and a plug window 2071 is defined on the other side of the barrier layer 207. The barrier layer 206, as mentioned before, is located between the second dopant area 205 and the barrier layer 207. If the first dopant area 202 and the second dopant area 205 are negative-type dopant areas, without adding the barrier layer 206, the barrier layer 207 is adjacent to the second dopant area 205 (not shown). Further, one embodiment of the barrier layer 207 is a thin film formed by Ti, TiN and Ti to enhance the adhesion of the plug.

Figure 2E:
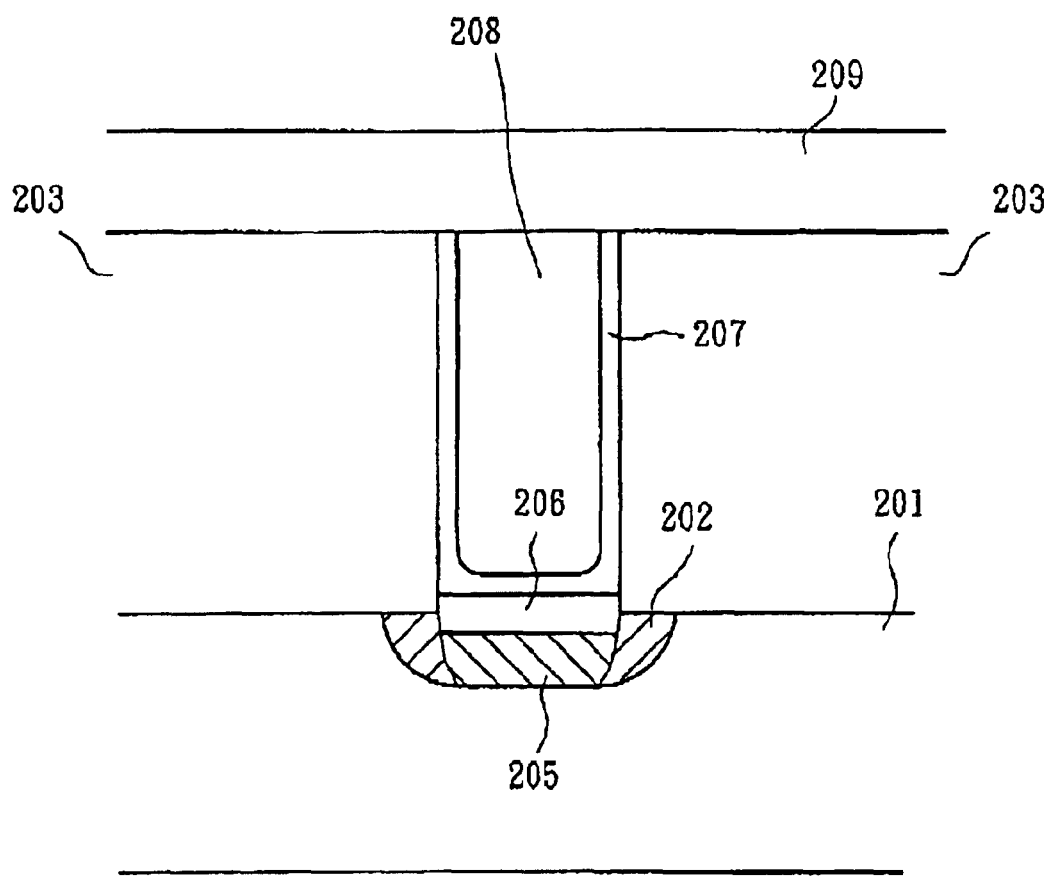
FIG. 2E depicts the fifth step of the embodiment of the present invention.

Next, reference is made to FIG. 3 and FIG. 2E. A plug 208 (step 316) is formed in plug window 2071. Then conductive interconnecting lines 209 are formed on the dielectric layer 203 (step 318).

Due to the manufacturing procedure of the conductive interconnecting lines 209, it is usually due to temperature that the dopant of the first dopant area 202 and the second dopant area 205 are inactivated, thus lowering or losing the electric conductivity of the plug 208. Hence, after the step of forming the conductive interconnecting lines 209, rapid thermal annealing (step 320) is performed to reactivate the first dopant area 202 and the second dopant area to 205 in what is known as a Rapid Thermal Processing (RTP). One method of RTP is to heat 100 degrees Celsius per second with an HT Oxidation Furnace. In seconds, the temperature arrives at a predetermined temperature. Then, a few seconds later, the temperature returns from high to the original temperature.

Reference will now be made in detail to the present preferred embodiments of the invention.

Figure 4:
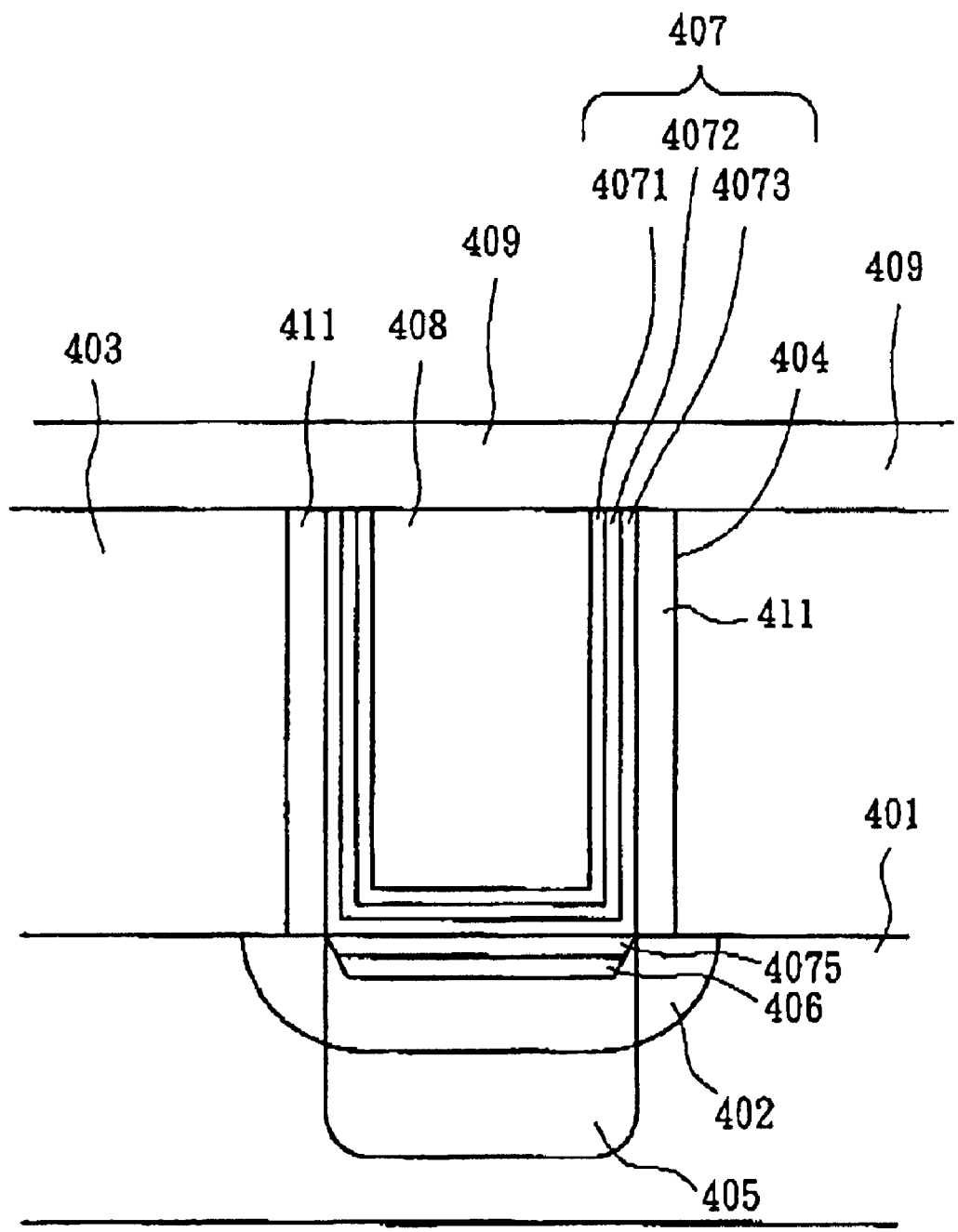
FIG. 4 depicts the plug structure according to one preferred embodiment of the present invention.

The preferred embodiment of the invention and method for manufacturing the same is depicted in FIG. 4.

First, a first dopant area 402 is formed on a substrate 401. In the preferred embodiment, the first dopant area 402 is doped with boron to form source, drain or similar devices for different purposes on the semiconductor. A BPSG layer 403 is deposited on the substrate 401 as a dielectric layer.

BPSG layer 403 is then etched to form a contact window 404 which is adjacent to the first dopant area 402. Typically, after forming the contact window 404, a $Si_3N_4$ layer 411 is formed as a spacer.

Then, the substrate 401 is doped through the contact window 404 with a higher concentration of boron to form a second dopant area 405. Next, a silicon-germanium layer 406 is deposited as a barrier layer by CVD or PVD. Another method for forming the silicon-germanium layer 406 is to implant the germanium into the substrate 401 which is mainly made of silicon. Next, a Ti layer 4073, a TiN layer 4072 and a Ti layer 4071 are sequentially deposited thereon as a barrier layer 407. When the Ti layer 4073 is formed on the substrate, the titanium partially reacts with the substrate 401 and a $TiSi_2$ layer 4075 is formed thereafter as a boundary layer. Next, a W-plug 408 is formed above the barrier layer 407. After planarization, conductive interconnecting lines 409 are formed on the dielectric layer 403.

Because the conductive interconnecting lines 409 should be formed at a high temperature for a long time, the boron in the first dopant area 402 and the second dopant area 405 are inactivated, thus lowering the electric conductivity of the dopant area. A rapid thermal annealing is adopted to reactivate the dopant area.

Diffusion of the boron occurs during the thermal process. If the boron should diffuse to the $TiSi_2$ layer 4075 which was mentioned before, a TiB alloy can be formed and raise the contact resistance. However, in this embodiment, a silicon-germanium layer is formed between the first dopant area 402, the second dopant area 405 and the $TiSi_2$ layer 4075. The diffusion rate of the boron in silicon-germanium layer 406 is slower than in the silicon substrate. For example, at 800 degrees Celsius, the diffusion rate of the boron in the silicon substrate is 1E-16 $cm^2/s$ but in the silicon-germanium layer (the ratio of two elements are 20 percent with germanium and 80 percent with silicon) is 1E-17 $cm^2/s$. Therefore, due to the existence of the silicon-germanium layer 406, the boron does not diffuse by thermal diffusion to the $TiSi_2$ layer 4075 in the process of forming the conductive interconnecting lines or the rapid thermal annealing.

Above all, the manufacturing method of a plug structure disclosed by the present invention has a characteristic of low contact resistance. The method provides an important promotion of the semiconductor quality in view of increasing density of semiconductors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a plug structure having low contact resistance on a substrate having a first dopant area, wherein the first dopant area is a positive-type dopant area, and the method comprising:

forming a dielectric layer on the substrate;

forming a contact window within the dielectric layer wherein a bottom of the contact window partially exposes the first dopant area;

forming a second dopant area within the substrate wherein a part of the second dopant area is overlaid with a part of the first dopant area, and the second dopant area is a positive-type dopant area;

forming a first barrier layer having a barrier element on a border between the contact window and the second dopant area, wherein the barrier element is germanium;

forming a second barrier layer on a sidewall and the bottom of the contact window;

forming a metal plug within the contact window, and filling the contact window with the metal plug;

forming a conductive interconnecting line on the dielectric layer; and performing a rapid thermal annealing.

2. The method of claim 1, wherein the first barrier layer is a silicon-germanium layer.

3. The method of claim 2, wherein an ion implantation is used to drive in the germanium to the second dopant area and form the first barrier layer.

4. The method of claim 2, wherein the silicon-germanium layer is formed by a physical vapor deposition process.

5. The method of claim 2, wherein the silicon-germanium layer is formed by a chemical vapor deposition process.

6. The method of claim 2, wherein the positive-type dopant area is doped with boron.

7. The method of claim 6, wherein the second barrier layer includes a first Ti layer, a TiN layer and a second Ti layer, sequentially.

8. The method of claim 7, wherein the plug is made of tungsten.

9. A plug structure having low contact resistance, the plug structure comprising:

a substrate having a positive-type dopant area;

a dielectric layer positioned on the substrate and a contact window is defined with the dielectric layer and the substrate;

a first barrier layer, wherein an outer surface of the first barrier layer is adjacent to the contact window and an inner surface of the first barrier layer defines a plug window;

a plug formed into the plug window; and a second barrier layer positioned between the positive-type dopant area and the first barrier layer and separating the positive-type dopant area and the first barrier layer, wherein the second barrier layer consists of germanium, and the first barrier layer includes a boundary layer adjacent to the second barrier layer.

10. The structure of claim 9, wherein the second barrier layer is a silicon-germanium layer.

11. The structure of claim 9, wherein the positive-type dopant area is doped with boron and the boundary layer is a $TiSi_2$ layer, wherein the first barrier layer includes a Ti layer, a TiN layer and a Ti layer sequentially formed thereon.

12. The structure of claim 9, wherein the plug is made of tungsten.

13. A method of manufacturing a plug structure having low contact resistance on a substrate having a first dopant area, wherein the first dopant area is a positive-type dopant area, and the method comprising:

forming a dielectric layer on the substrate;

forming a contact window within the dielectric layer wherein a bottom of the contact window partially exposes the first dopant area;

forming a second dopant area within the substrate, wherein a part of the second dopant area is overlaid with a part of the first dopant area, and the second dopant area is a positive-type dopant area;

forming a first barrier layer having a barrier element on a border between the contact window and the second dopant area, wherein the barrier element is germanium, and the first barrier layer is a silicon-germanium layer;

forming a second barrier layer on a sidewall and the bottom of the contact window;

forming a metal plug within the contact window, and filling the contact window with the metal plug;

forming a conductive interconnecting line on the dielectric layer; and performing a rapid thermal annealing.

14. The method of claim 13, wherein an ion implantation is used to drive in the germanium to the second dopant area and form the first barrier layer.

* * * * *